(12) United States Patent
Lin (10) Patent No.: US 7,492,297 B2
(45) Date of Patent: Feb. 17, 2009

(54) DIGITAL-TO-ANALOG CONVERTER AND METHOD THEREOF

(75) Inventor: Chia-Liang Lin, Union City, CA (US)

(73) Assignee: Realtek Semiconductor Corp., Hsinchu (TW)

( * ) Notice: Subject to any disclaimer, the term of this patent is extended or adjusted under 35 U.S.C. 154(b) by 0 days.

(21) Appl. No.: 11/738,965

(22) Filed: Apr. 23, 2007

(65) Prior Publication Data

US 2008/0036635 A1 Feb. 14, 2008

Related U.S. Application Data

(60) Provisional application No. 60/822,078, filed on Aug. 11, 2006.

(51) Int. Cl.
 *H03M 1/66* (2006.01)
(52) U.S. Cl. ........................................ 341/144; 341/150
(58) Field of Classification Search ................ 341/144, 341/143, 150, 145
See application file for complete search history.

(56) References Cited

U.S. PATENT DOCUMENTS

| | | | |
|---|---|---|---|
| 4,441,136 A | 4/1984 | Hampshire | |
| 5,148,169 A * | 9/1992 | Bustance et al. | 341/156 |
| 5,187,482 A | 2/1993 | Tiemann et al. | |
| 5,404,142 A | 4/1995 | Adams et al. | |
| 5,684,482 A | 11/1997 | Galton | |
| 5,949,362 A | 9/1999 | Tesch et al. | |
| 5,977,899 A * | 11/1999 | Adams | 341/145 |
| 6,304,608 B1 | 10/2001 | Chen et al. | |
| 6,697,004 B1 | 2/2004 | Galton et al. | |
| 6,897,797 B2 * | 5/2005 | Zhao et al. | 341/144 |
| 6,961,013 B2 | 11/2005 | Lin et al. | |
| 7,330,060 B2 * | 2/2008 | Abel et al. | 327/158 |

* cited by examiner

*Primary Examiner*—Brian Young
(74) *Attorney, Agent, or Firm*—Knobbe, Martens, Olson & Bear LLP (57) ABSTRACT

A digitally controlled analog circuit comprises a finite state machine configured for receiving a digital input word and generating at least two digital codes in a manner determined by a state of the finite state machine. The digital codes are decoded into respective sets of binary data. The sets of binary data control respective switched-circuit arrays to generate an analog output corresponding to the digital input word. To establish a monotonic function between the digital input word and the analog output during steady state operations, the finite state machine switches states when a wrap-around condition is detected for one of the digital codes. The finite state machine uses different sets of equations in different states to derive the digital codes.

21 Claims, 6 Drawing Sheets

DIGITAL-TO-ANALOG CONVERTER AND METHOD THEREOF

The present application claims priority benefits under 35 U.S.C. § 119(e) from U.S. Provisional Application No. 60/822,078, filed on Aug. 11, 2006, entitled "Digital-to-Analog Converter and Method Thereof," which is hereby incorporated herein in its entirety by reference.

BACKGROUND OF THE INVENTION

1. Field of the Invention

The present invention relates to a digital-to-analog converter and in particular to a method and apparatus for improving monotonicity in a digital-to-analog converter.

2. Description of the Related Art

A digital-to-analog converter (DAC) is an important device for many applications. A DAC is an analog circuit whose output characteristics are controlled by a digital control word. While the present invention is generally related to a DAC and can be practiced in a general-purpose DAC, it is particularly useful for a special application of a digitally controlled oscillator (DCO).

A DCO is a device that generates a periodic signal having a frequency controlled by a digital control word. A DCO usually comprises an adjustable circuit element whose value determines the oscillation frequency of the DCO. The digital control word is used to set the value of the adjustable circuit element and to determine the oscillation frequency. For example, an LC oscillator with an oscillation frequency of approximately $$f_{osc} = \frac{1}{2\pi\sqrt{LC}}$$

can be implemented as a DCO with a fixed inductor L and a variable capacitor C. The capacitance value of the variable capacitor is controlled by a digital control word. The DCO is a special case of a DAC since it receives a digital control word and outputs an analog signal in response to the digital control word.

Figure 1:
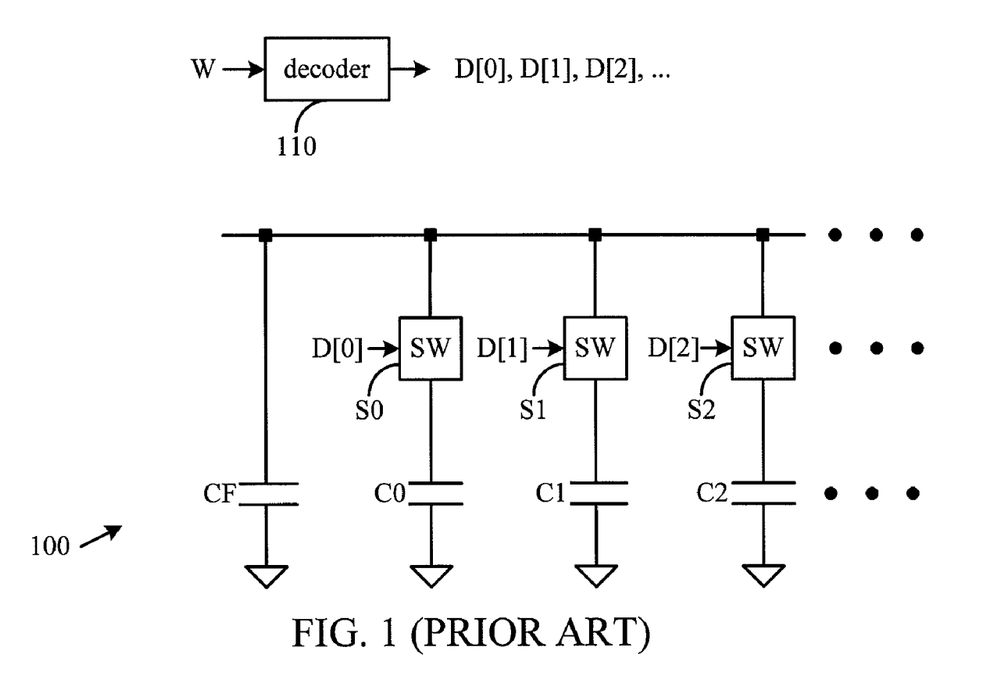
FIG. 1 illustrates one example of a digitally controlled variable capacitor.

FIG. 1 depicts a typical digitally controlled variable capacitor 100 comprising a decoder 110, a fixed capacitor CF, a plurality of switched capacitors (e.g., C0, C1, C2) and a plurality of switches (e.g., S0, S1, S2). The decoder 110 receives a digital control word W and generates a plurality of binary data (e.g., D[0], D[1], D[2]) to respectively control the plurality of switches. The total effective capacitance of the variable capacitor 100 is $C_{eff}=CF+C0 \cdot D[0]+C1 \cdot D[1]+C2 \cdot D[2]+\ldots$. Thus, the oscillation frequency of an LC oscillator comprising the variable capacitor 100 is determined by the digital control word W.

There are three important characteristics concerning a DCO: range, resolution, and monotonicity. The range and the granularity of the values of the adjustable circuit element respectively determine the range and the resolution of the DCO. For example, the resolution of the aforementioned LC oscillator is determined by the minimum capacitance among the switched capacitors (e.g., C0, C1, C2) while the range is determined by the maximum total effective capacitance (e.g., $C_{eff}(max)=CF+C0+C1+C2+\ldots$) and the minimum total effective capacitance (e.g., $C_{eff}(min)=CF$). The monotonicity of the DCO is met if the value of the adjustable circuit element changes consistently (e.g., increases or decreases as the digital control word increases or decreases). For example, the monotonicity of the above mentioned LC oscillator is met if a greater control word results in a greater total effective capacitance.

A DCO is usually incorporated in a digital phase lock loop (DPLL) to generate an output clock of a target frequency. A digital control word for the DCO is established in a closed-loop manner to control the oscillation frequency of the DCO. The digital control word has a limited resolution and so the instantaneous oscillation frequency of DCO also has a limited resolution. In practice, the instantaneous oscillation frequency of the DCO is unlikely to be exactly the same as the target frequency. A prior art DPLL usually requires a strictly monotonic DCO to ensure stable operations. For example, in an application in which a greater digital control word corresponds to a greater output frequency, the DPLL will seek to decrease the digital control word to decrease an output frequency that is higher than the target frequency or increase the digital control word to increase an output frequency that is lower than the target frequency. In a steady state of a stable DPLL, the digital control word usually fluctuates between two values, one corresponding to an output frequency slightly higher than the target frequency and another corresponding to an output frequency slightly lower than the target frequency such that an average output frequency is approximately equal to the target frequency.

Fluctuations in the digital control word results in unwanted jitters in the output clock. The jitters can be reduced by increasing the resolution of the DCO such that the instantaneous oscillation frequency can be closer to the target frequency. A DPLL, however, is subject to disturbance due to noise and the digital control word may momentarily drift away from its steady state values in response to the disturbance. Fortunately, the effect of the disturbance is only temporary if the DCO is monotonic. For example, if the digital control word drifts higher (or lower) due to a disturbance, the DPLL will detect that the output frequency is too high (or too low) and will decrease (or increase) the average value of the digital control word to correct the error. If the DCO is not strictly monotonic, the DPLL may adjust the digital word in an erroneous direction and cause increased jitters or loop instability.

One way to guarantee strict monotonicity in a DCO is to use a thermometer-code decoding scheme. Table 1 illustrates one example of a thermometer-code decoding scheme for mapping a digital control word W into eight binary data (e.g., D0, D1, ... D7). Referring to the aforementioned LC oscillator by way of example, every incremental change in the digital control word W results in an additional control bit turning on to increase the total effective capacitance. Thus, monotonicity is guaranteed. It is generally difficult to ensure monotonicity without using the thermometer-code decoding scheme. The thermometer-code decoding scheme, however, usually requires a very high number of switched capacitors. What is needed is a DCO with a reduced number of switched elements and that still virtually guarantees monotonicity.

TABLE 1

| W | 0 | 1 | 2 | 3 | 4 | 5 | 6 | 7 | 8 |
|---|---|---|---|---|---|---|---|---|---|
| D[0] | 0 | 1 | 1 | 1 | 1 | 1 | 1 | 1 | 1 |
| D[1] | 0 | 0 | 1 | 1 | 1 | 1 | 1 | 1 | 1 |
| D[2] | 0 | 0 | 0 | 1 | 1 | 1 | 1 | 1 | 1 |
| D[3] | 0 | 0 | 0 | 0 | 1 | 1 | 1 | 1 | 1 |
| D[4] | 0 | 0 | 0 | 0 | 0 | 1 | 1 | 1 | 1 |
| D[5] | 0 | 0 | 0 | 0 | 0 | 0 | 1 | 1 | 1 |
| D[6] | 0 | 0 | 0 | 0 | 0 | 0 | 0 | 1 | 1 |
| D[7] | 0 | 0 | 0 | 0 | 0 | 0 | 0 | 0 | 1 |

SUMMARY OF THE INVENTION

The present invention solves these and other problems by providing a DAC (or digitally controlled analog circuit) comprising a finite state machine configured for receiving a digital input word (or digital control word) and generating at least a first digital code and a second digital code based on the digital input word in a manner determined by a state of the finite-state machine. In one embodiment, the finite state machine makes a state transition upon detecting a wrap-around condition in the second digital code. In one embodiment, the finite state machine changes states to improve monotonicity for the DAC during steady state operations without having to rely on a strictly thermometer-code decoding scheme.

In one application, the digital input word is mapped such that the first digital code represents most significant bits (MSBs) of the digital input word and the second digital code represents least significant bits (LSBs) of the digital input word. One way to detect the wrap-around condition is to determine when the second digital code increases in value in response to a decrease in value of the digital input word or decreases in value in response to an increase in value of the digital input word. In one embodiment, the first digital code has a first range of values and the second digital code has a second range of values that partially overlaps with the first range of values. For example, the second digital code has a maximum value that is greater than (e.g., at least twice) a value represented by a LSB of the first digital code.

In one embodiment, the finite state machine has a first state and a second state. The second digital code is generated in the first state by performing a modulo operation with the digital input word as a dividend. The second digital code is generated in the second state by performing a modulo operation with a sum of the input word and an offset as a dividend. A common divisor is used in the modulo operation of the first state and the modulo operation of the second state. In one embodiment, the offset has a value that is less than (e.g., approximately half of) a value of the common divisor.

In one embodiment, the DAC further comprises a first decoder and a second decoder (e.g., binary code decoders or thermometer code decoders). The first decoder maps the first digital code into a first group of binary data and a first switched-circuit array can generate a first analog output in response to the first group of binary data. The second decoder maps the second digital code into a second group of binary data and a second switched-circuit array can generate a second analog output in response to the second group of binary data. A combination of the first analog output and the second analog output results in an analog output signal corresponding to the digital input word. For example, each group of binary data controls a group of switched circuits in the respective switched-circuit array (e.g., a digitally controlled variable capacitor or a plurality of switched current sources) to generate an analog output that is provided to a common circuit node corresponding to an output of the DAC. In one application, the DAC is used in a digitally controlled oscillator and the analog output is a variable capacitance that determines an oscillation frequency in accordance with the digital input word.

In one embodiment, a method for converting a digital input word into an analog output signal (or digitally controlling an analog circuit) comprises generating a first digital code and a second digital code based on the digital input word in a scheme determined by a value of a state variable. For example, the method toggles (or switches) between a first algorithm and a second algorithm to generate the second digital code, wherein the toggling occurs whenever the second digital code makes an abrupt (or sudden) change from a relatively low value (e.g., a value close to a minimum value) to a relatively high value (or a value close to a maximum value) or from a relatively high value to a relatively low value within a short period of time (e.g., 1-2 clock cycles or a low number of clock cycles).

In one embodiment, the first digital code represents the MSBs of the digital input word and the second digital code represents LSBs of the digital input word. One method for detecting abrupt changes (e.g., a boundary condition or a wrap-around condition) in the second digital code comprises determining when the second digital code increases in value in response to a decrease in value of the digital input word or decreases in value in response to an increase in value of the digital input word. The first digital code and the second digital code can have overlapping ranges of value. In one embodiment, the LSB of the first digital code has a value that is approximately half of a maximum value of the second digital code.

In one embodiment, the first algorithm comprises a first modulo operation with the digital input word as a dividend and the second algorithm comprises a second modulo operation with a sum of the digital input word and an offset as a dividend. A common divisor is used in the first modulo operation and the second modulo operation with the common divisor having a value that is greater than (e.g., approximately twice of) a value of the offset. The first digital code is generated by dividing a difference between the digital input word and the second digital code by the offset.

The first digital code is converted into a first analog output and the second digital code is converted into a second analog output, wherein the combination of the first analog output and the second analog output results in an analog signal corresponding to the digital input word. In one embodiment, the first digital code and the second digital code are decoded into respective first and second groups of binary data. In one application, the first digital code is mapped into the first group of binary data using a binary code decoder while the second digital code is mapped into the second group of binary data using a thermometer code decoder. The first group of binary data controls a first group of switches in a first switched-circuit array and the second group of binary data controls a second group of switches in a second switched-circuit array. The analog signal is generated by coupling an output of the first switched-circuit array with an output of the second switched-circuit array.

For purposes of summarizing the invention, certain aspects, advantages, and novel features of the invention have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

BRIEF DESCRIPTION OF THE DRAWINGS

A general architecture that implements the various features of the invention will now be described with reference to the drawings. The drawings and the associated descriptions are provided to illustrate embodiments of the invention and not to limit the scope of the invention. Throughout the drawings, reference numbers are re-used to indicate correspondence between referenced elements.

DETAILED DESCRIPTION OF THE PREFERRED EMBODIMENT

The present invention relates to a method and apparatus for converting a digital input word into an analog output signal. While the specifications describes several example embodiments of the invention, it should be understood that the invention can be implemented in many ways and is not limited to the particular examples described below or to the particular manner in which any features of such examples are implemented.

Figure 2:
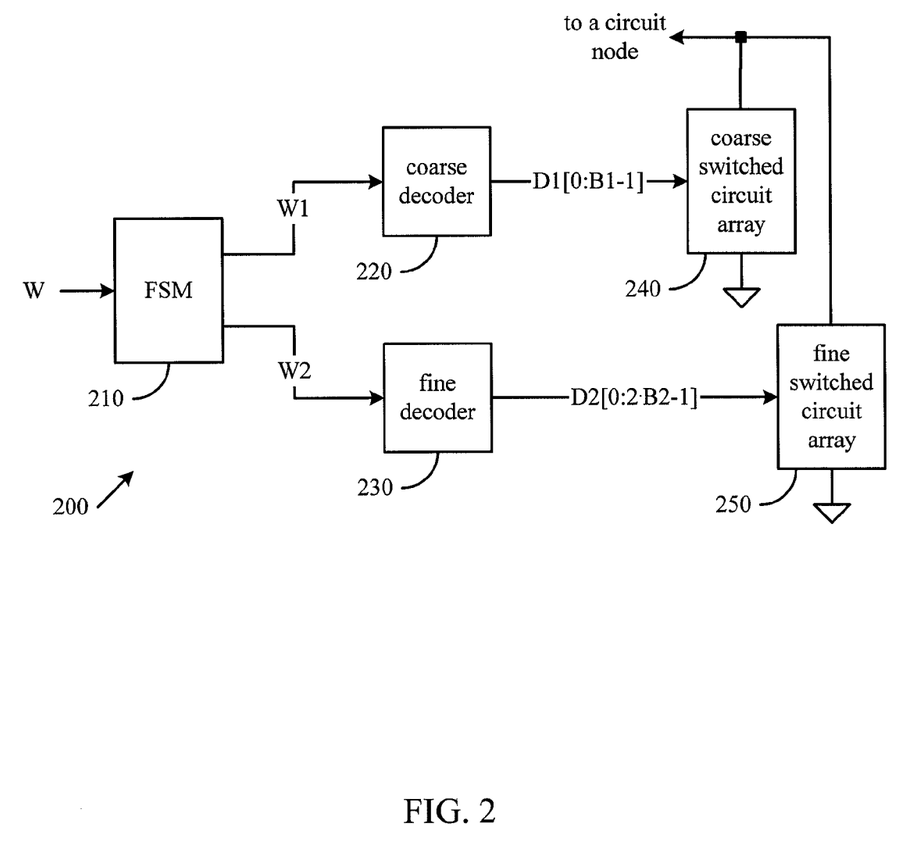
FIG. 2 is a block diagram of a digitally controlled analog circuit in accordance with one embodiment of the present invention.

As mentioned above, DACs (or digitally controlled analog circuits) are used in digitally controlled oscillator applications. FIG. 2 illustrates a DAC 200 in accordance with one embodiment of the present invention. The DAC 200 comprises a finite state machine (FSM) 210 configured for receiving a digital input word (W) and for generating two output digital codes (W1 and W2). A coarse decoder 220 decodes (or maps) a first digital code (W1) into B1 bits of data (e.g., D1[0:B1−1] or a first set of binary data) and a fine decoder 230 decodes a second digital code (W2) into two times B2 bits of data (e.g., D2[0:2B2−1] or a second set of binary data). The first set of binary data is provided to a coarse switched-circuit array 240 and controls a plurality of (e.g., B1) switched circuits in the coarse switched-circuit array 240. The second set of binary data is provided to a fine switched-circuit array 250 and controls a plurality of (e.g., two times B2) switched circuits in the fine switched-circuit array 250. An output of the coarse switched-circuit array 240 and an output of the fine switched-circuit array 250 are coupled to a common circuit node to generate an analog output of the DAC 200. In one embodiment, the fine decoder 230 is a thermometer-code decoder while the coarse decoder 220 is either a binary code or a thermometer-code decoder.

Figure 3:
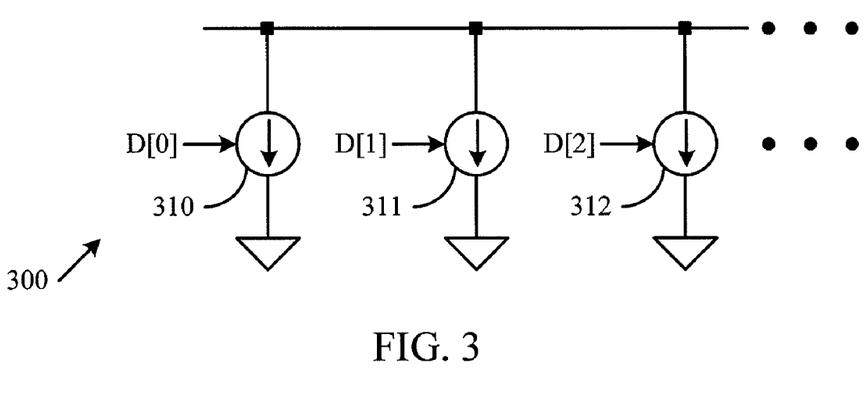
FIG. 3 illustrates one embodiment of a switched current source array.

In one embodiment, the switched-circuit arrays 240, 250 are implemented as digitally controlled variable capacitors. FIG. 1 illustrates one configuration for a digitally controlled variable capacitor. In another embodiment, the switched-circuit arrays 240, 250 are implemented as digitally controlled current sources. FIG. 3 illustrates one configuration for a digital controlled current source comprising a plurality of switched currents 310, 311, 312. For example, a switched current can be implemented using a metal-oxide-semiconductor field-effect-transistor (MOSFET) with a gate terminal coupled to a binary control signal, such as a data bit from the first or second set of binary data.

By way of an example and with reference to FIG. 1, the switched-circuit arrays 240, 250 are implemented as digitally controlled capacitors in one application. The coarse switched-circuit array 240 comprises B1 capacitors (e.g., $C0^{(1)}$, $C1^{(1)}$, $C2^{(1)}$, and so on) along with B1 switches respectively controlled by the a first set of binary data (e.g., D1[0], D1[1], D1[2], and so on). Similarly, the fine switched-circuit array 250 comprises two times B2 capacitors (e.g., $C0^{(2)}$, $C1^{(2)}$, $C2^{(2)}$, and so on) along with two times B2 switches respectively controlled by the a second set of binary data (e.g., D2[0], D2[1], D2[2], and so on). In one embodiment, the fine decoder 230 is a thermometer-code decoder and the capacitors in the fine switched-circuit array 250 have substantially identical (or approximately the same) capacitance denoted by a fine capacitance value $C^{(fine)}$.

In one embodiment, the coarse decoder 220 is also a thermometer-code decoder and the capacitors in the coarse switched-circuit array 240 are substantially equally weighted (e.g., have approximately the same capacitance denoted by a coarse capacitance value $C^{(coarse)}$). In another embodiment, the coarse decoder 220 is a binary code decoder and the capacitors in the coarse switched-circuit array 240 are approximately weighted by powers of two. For example, the capacitors have respective approximate values of $2^0 \cdot C^{(coarse)}$, $2^1 \cdot C^{(coarse)}$, $2^2 \cdot C^{(coarse)}$, and so on. In either embodiment, the coarse capacitance value is approximately B2 times the fine capacitance value. In other words, the maximum total capacitance of the two times B2 capacitors in the fine switched-circuit array 250 is approximately twice of the minimum capacitance among the B1 capacitors in the coarse switched-circuit array 240. The coarse capacitance value $C^{(coarse)}$, which is approximately the minimum capacitance among the B1 capacitors in the coarse switched-circuit array 240, is also referred to as the LSB of the coarse switched-circuit array 240. The fine capacitance value $C^{(fine)}$ is the nominal capacitance for each of the capacitors in the fine switched-circuit array 250 and is referred to as the LSB of the fine switched-circuit array 250. In the above particular example, the LSB of the coarse switched-circuit array 240 is approximately B2 times higher (or bigger) than the LSB of the fine switched-circuit array 250.

Figure 4:
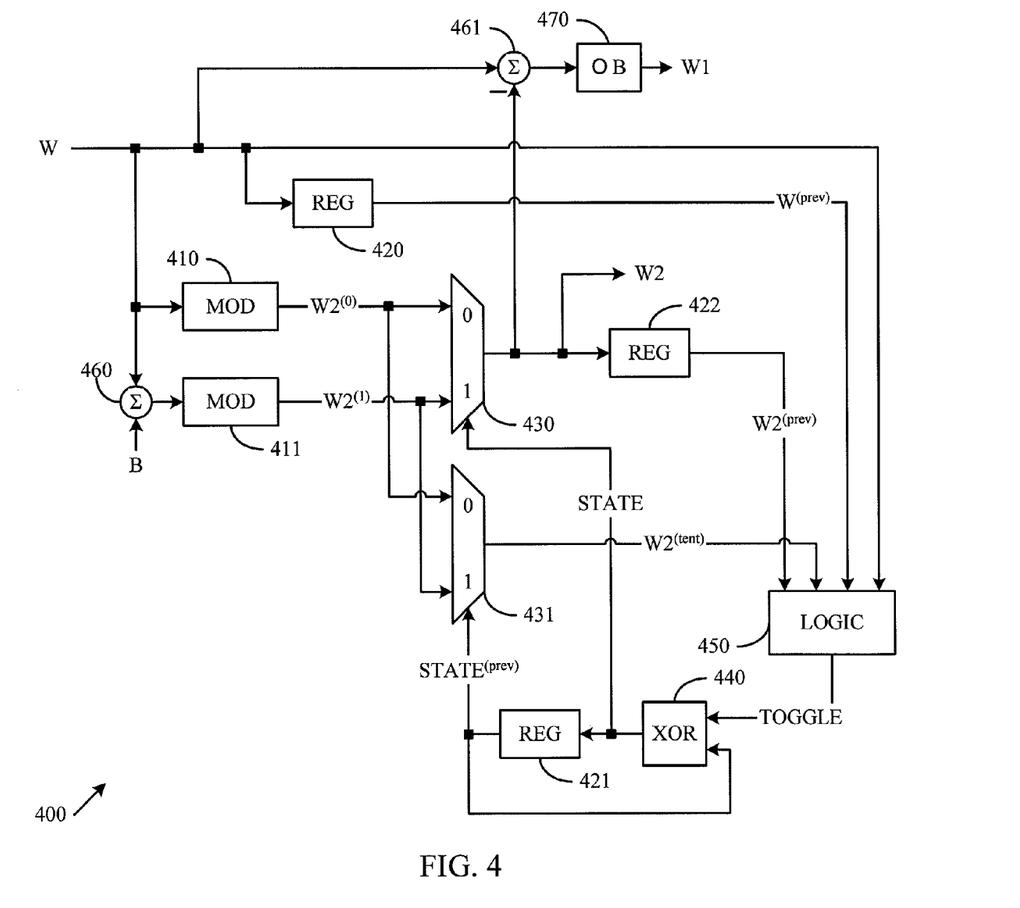
FIG. 4 is a block diagram of one embodiment of a finite-state machine for the digitally controlled analog circuit shown in FIG. 2.

FIG. 4 depicts one embodiment of a finite state machine (FSM) 400 that can be used as the FSM 210 in FIG. 2. The FSM 400 receives a digital control word W and generates first output word W1 and a second output word W2. In one embodiment, the FSM 400 comprises a first register (REG) 420 configured to receive the digital control word W and to output a previous control word $W^{(prev)}$ which corresponds to a previous value of the digital control word. A first modulus operator (or circuit) MOD 410 also receives the digital control word and generates a first intermediate word $W2^{(0)}$ by performing the following mathematical operation: $W2^{(0)}$ =mod(W, 2·B). That is, the first intermediate word is a modulus after division of the digital control word by 2·B. B can be any positive integer number. In one embodiment, B is a positive integer number that is also a power of two to simplify hardware implementation. In one application in which the fine decoder 230 of FIG. 2 is a thermometer-code decoder, B is equal to B1.

The digital control word is also provided to a first summing operator 460 that combines the digital control word with an offset (B). An output of the first summing operator 460 is provided to a second modulus operator MOD 411 which generates a second intermediate word $W2^{(1)}$ by performing the following mathematical operation: $W2^{(1)}$=mod(W+B, 2·B). That is, the second intermediate word is a modulus after division of a sum of the digital control word and the offset by two times the offset.

The first intermediate word and the second intermediate word are provided to a first multiplexer 430 to generate the second output word W2. The second output word is selected between the first intermediate word $W2^{(0)}$ and the second intermediate word $W2^{(1)}$ according to the value of a state variable STATE. The first intermediate word and the second intermediate word are also provided to a second multiplexer 431 to generate a tentative word $W2^{(tent)}$. The tentative word is selected between the first intermediate word $W2^{(0)}$ and the second intermediate word $W2^{(1)}$ according to the value of a previous state variable $STATE^{(prev)}$. A second register REG 421 receives the state variable STATE and outputs the previous state variable $STATE^{(prev)}$.

The second output word W2 is provided to a third register 422 to generate a previous second output word $W2^{(prev)}$ which corresponds to the previous value of the second output word. The previous second output word is provided to a logical operator LOGIC 450. The logical operator LOGIC 450 also receives the digital control word W, the previous control word $W^{(prev)}$, and the tentative word $W2^{(tent)}$ to generate a logical signal TOGGLE by performing the following logical operation:

$$TOGGLE=((W>W^{(prev)}\&W2^{(tent)}<W2^{(prev)})|(W<W^{(prev)}\&W2^{(tent)}>W2^{(prev)})).$$

In the above equation, the symbol "&" denotes a logical "AND" operation and the symbol "|" denotes a logical "OR" operation. The above logical operation is one way to determine a wrap-around condition in the second output word. Other ways are also possible.

The logical signal TOGGLE is provided to a logical operator XOR 440. The logical operator XOR 440 also receives the previous state variable $STATE^{(prev)}$ to generate the state variable STATE. For example, the current value of the state variable STATE is derived by performing a logical exclusive-OR operation on the logical signal TOGGLE and the previous state variable $STATE^{(prev)}$. The state variable STATE changes state whenever the logical signal TOGGLE is high (or set). Finally, the FSM 400 further comprises a second summing operator 461 and a division operator 470 to generate the first output word W1 by performing the following mathematical operations: W1=(W−W2)/B.

Figure 5:
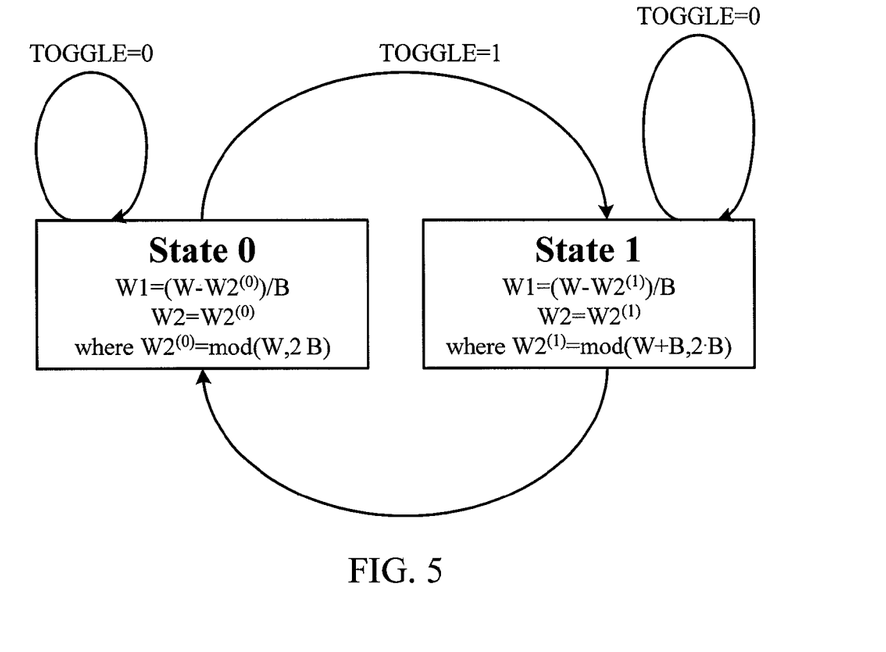
FIG. 5 is a state diagram for the finite-state machine shown in FIG. 4.

FIG. 5 depicts a state diagram for the FSM 400 shown in FIG. 4. For example, the FSM 400 has two states: a first state (i.e., State 0 or STATE=0) and a second state (i.e., State 1 or STATE=1). In the first state, the first and second output words are derived as follows:

$$W1=(W-\mathrm{mod}(W,2\cdot B))/B; \text{ and}$$

$$W2=\mathrm{mod}(W,2\cdot B).$$

In the second state, the first and second output words are derived as follows:

$$W1=(W-\mathrm{mod}(W+B,2\cdot B))/B; \text{ and}$$

$$W2=\mathrm{mod}(W+B,2\cdot B).$$

In one embodiment, the FSM 400 transitions from one state to another when the logical signal TOGGLE is set to 1. The logical signal TOGGLE is set to 1 when the second output word exhibits a wrap-around condition. One way to detect the wrap-around condition is by determining when a current value of the digital control word W is greater than a previous value of the digital control word while a tentative value of the second output word is less than a previous value of the second output word or when a current value of the digital control word W is less than a previous value of the digital control word while a tentative value of the second output word is greater than a previous value of the second output word. The tentative value of the second output word is determined with an assumption that the FSM 400 remains in a current state. Other ways to detect when the second output word wraps around is also possible.

In a digital phase lock loop (DPLL) application, the digital control word is generated in a closed-loop manner and abrupt changes (e.g., glitches, a big value change or wrap-around conditions) in the loop are not desirable during steady-state operations. The digital control word generally fluctuates between two values or within to a small range of values during steady-state operations. If the values for the digital control word result in a second output code having a value close to its extreme values, the second output code is likely to wrap-around in response to fluctuations (or slight changes) in the digital control word. For example, the second output code can oscillate between relatively low values close to its minimum value and relatively high values close to its maximum value (e.g., have abrupt value changes in an approximate range of ±2·B) in response to a small increase/decrease in the digital control word due to wrap-around conditions. At the same time, the first output code will compensate by having abrupt value changes in about the same value range but in an opposite direction to the second output code (e.g., ∓2 under an assumption that a LSB of the first output code is weighted approximately B times higher than a LSB of the second output code).

In an ideal implementation, the abrupt changes in the first and second output codes offset each other and are not apparent in a combined output (e.g., a total effective capacitance controlled by the first and second output codes). In practice, however, finite component tolerance and other manufacturing limitations may result in a glitch for the combined output. For example, a glitch in the total effective capacitance can occur when the LSB of the first output code is not be weighted exactly B times higher than the LSB of the second output code due to finite component tolerance for capacitors in the coarse and fine switched-circuit arrays 240, 250. In one embodiment, the total effective capacitance makes an unintended abrupt change when the second output code wraps around.

In one embodiment, the FSM 400 detects for likely wrap-around conditions (or boundary conditions) in the second output code and toggles a state variable STATE to cause a state change. A different set of equations is used in a different state for deriving the first and second output codes, thereby avoiding undesirable abrupt changes in the first and second output codes. For example, the logical signal TOGGLE is set to 1 to indicate likely wrap-around conditions (or that the second output code is near its boundary limits) and the FSM 400 changes to a different state in which the second output code has a value closer to the middle of its range.

Changing to a different state may not eliminate an initial glitch in a combined output controlled by the first and second output codes. However, the second output code W2 is shifted (or adjusted) away from its boundary values (or extreme values 0 and 2·B) and centered near its mid-range value (e.g., approximately B) after changing states. Thus, any glitch or abrupt change becomes a one-time event. The frequency of state changes depends in part on B (or the range of the second output code). In one embodiment, the range of the second output code is sufficiently large (e.g., a relatively large B) such that state changes occur infrequently during steady-state operations in DPLL applications.

Figure 6:
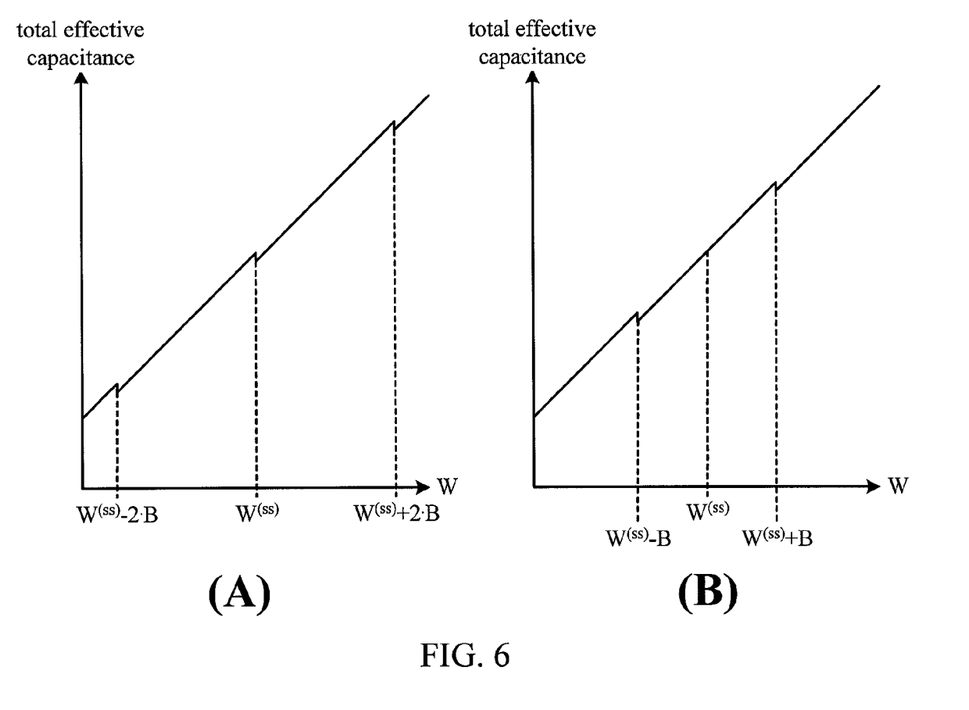
FIG. 6A is a graph illustrating a transfer function of an analog output in response to a digital input word under a scenario where the analog output changes abruptly during steady-state operation.
FIG. 6B is a graph illustrating a transfer function of an analog output in response to a digital input word under a scenario where the analog output has smooth transitions during steady-state operation, due in part to a finite state machine toggling to a different state.

FIGS. 6A and 6B show graphs of total effective capacitance in response to a digital control word to illustrate some principles of the present invention. For example, the digital control word fluctuates within a range near a steady state value $W^{(ss)}$ during steady state operations. If the FSM 400 is currently in the first state (STATE 0) and the steady state value is approximately an integer multiple of 2·B, a wrap-around condition is likely to occur for the second output code in response to fluctuations in the digital control word. The wrap-around condition can consequently cause the total effective capacitor to make an unintended jump (or abrupt change) as shown in FIG. 6A. As shown in FIG. 6A, the total effective capacitance may also have abrupt changes when the digital control word fluctuates about $W^{(ss)} \pm 2 \cdot B$ and the FSM 400 is in the first state.

To minimize abrupt changes in the total effective capacitance, the FSM 400 switches to a different state upon detecting a possible wrap-around condition for the second output code. For example, the FSM 400 toggles from the first state to the second state (STATE 1) to eliminate wrap-around conditions in the second output code or further abrupt changes in the total effective capacitance while the digital control word continues to fluctuate around the steady state value $W^{(ss)}$ as shown in FIG. 6B. The FSM 400 effectively re-centers the second output code about a mid-range value by switching to the second state.

In the second state, wrap-around conditions in the second output code may occur if the digital control word drifts toward $W^{(ss)} \pm B$. Thus, if there is no strong disturbance to cause the digital control word to drift by approximately B, the second output code does not wrap-around in response to steady state fluctuations by the digital control word and the total effective capacitance varies smoothly (e.g., without abrupt changes) during steady state operations. By choosing B to be sufficiently large, any wrap-around in the second output code will not be more than a one-time event in the steady-state operations of a DPLL.

In one embodiment, the second output code is sent to a thermometer-code decoder (e.g., the fine decoder 230) to generate binary data for controlling a variable capacitance that is part of the total effective capacitance. The thermometer-code decoder advantageously allows the total effective capacitance to virtually be a monotonic function of the digital control word as far as the regime of the DPLL operation is concerned. Alternately, a binary code decoder can be used to generate binary data based on the second output code. In that case, the binary data control switching capacitors with capacitance weighted by power-of-two's and the biggest change in total effective capacitance still occurs under a wrap-around condition. A strict monotonicity is no longer guaranteed, but an abrupt change in the total effective capacitance is still only a one-time event and only happens under a wrap-around condition.

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions, and changes in the form of the methods and systems described herein may be made without departing from the spirit of the inventions. The accompanying claims and their equivalents are intended to cover such forms or modifications as would fall within the scope and spirit of the inventions.

What is claimed is:

1. A digital-to-analog converter comprising:
    a finite state machine configured to generate at least a first digital code and a second digital code based on a digital input word and to make state transitions upon detecting a wrap-around condition in the second digital code;
    a first decoder configured to map the first digital code into a first group of binary data;
    a second decoder configured to map the second digital code into a second group of binary data;
    a first switched-circuit array configured to generate a first analog output in response to the first group of binary data; and
    a second switched-circuit array configured to generate a second analog output in response to the second group of binary data, wherein a combination of the first analog output and the second analog output results in an analog output signal corresponding to the digital input word.

2. The digital-to-analog converter of claim 1, wherein the wrap-around condition is detected by determining when the second digital code increases in value in response to a decrease in value of the digital input word or decreases in value in response to an increase in value of the digital input word.

3. The digital-to-analog converter of claim 1, wherein the first digital code represents most significant bits of the digital input word and has a first range of values, the second digital code represents least significant bits of the digital input word and has a second range of values, and the second range of values partially overlaps with the first range of values.

4. The digital-to-analog converter of claim 3, wherein the second digital code has a maximum value that is at least twice of a value represented by a least significant bit of the first digital code.

5. The digital-to-analog converter of claim 1, wherein the finite state machine has a first state and a second state, the second digital code is generated in the first state by performing a modulo operation with the digital input word as a dividend, and the second digital code is generated in the second state by performing a modulo operation with a sum of the digital input word and an offset as a dividend.

6. The digital-to-analog converter of claim 5, wherein a common divisor is used in the modulo operation of the first state and the modulo operation of the second state, and the offset has a value that is approximately half of a value of the common divisor.

7. The digital-to-analog converter of claim 1, wherein at least one of the first decoder and the second decoder is a binary code decoder.

8. The digital-to-analog converter of claim 1, wherein at least one of the first decoder and the second decoder is a thermometer code decoder.

9. The digital-to-analog converter of claim 1, wherein at least one of the first switched-circuit array and the second switched-circuit array comprises a digitally controlled variable capacitor.

10. The digital-to-analog converter of claim 1, wherein at least one of the first switched-circuit array and the second switched-circuit array comprises a plurality of switched current sources.

11. The digital-to-analog converter of claim 1, wherein the digital-to-analog converter is used in a digitally controlled oscillator application and the analog output signal is a variable capacitance that determines an oscillation frequency in accordance with the digital input word.

12. A method for converting a digital input word into an analog output signal, the method comprising:

generating a first digital code and a second digital code based on the digital input word, wherein the first digital code represents most significant bits of the digital input word, the second digital code represents least significant bits of the digital input word, and the first digital code and the second digital code have overlapping ranges of value;

toggling between a first algorithm and a second algorithm to generate the second digital code, wherein the toggling occurs whenever the second digital code makes an abrupt change from a relatively low value to a relatively high value or from a relatively high value to a relatively low value;

converting the first digital code into a first analog output; and converting the second digital code into a second analog output, wherein a combination the first analog output and the second analog output results in an analog signal corresponding to the digital input word.

13. The method of claim 12, further comprising the step of detecting abrupt changes in the second digital code by determining when the second digital code increases in value in response to a decrease in value of the digital input word or when the second digital code decreases in value in response to an increase in value of the digital input word.

14. The method of claim 12, wherein a least significant bit of the first digital code has a value that is approximately half of a maximum value of the second digital code.

15. The method of claim 12, wherein the first algorithm comprises a first modulo operation with the digital input word as a dividend and the second algorithm comprises a second modulo operation with a sum of the digital input word and an offset as a dividend.

16. The method of claim 15, wherein generating the first digital code comprises dividing a difference between the digital input word and the second digital code by the offset.

17. The method of claim 15, wherein a common divisor is used in the first modulo operation and the second modulo operation with the common divisor having a value that is approximately twice of a value of the offset.

18. The method of claim 12, wherein converting the first digital code into the first analog output comprises:
mapping the first digital code into a first group of binary data using a binary code decoder; and
controlling a first switched-circuit array with the first group of binary data to generate the first analog output.

19. The method of claim 12, wherein converting the second digital code into the second analog output comprises:
mapping the second digital code into a second group of binary data using a thermometer code decoder; and
controlling a second switched-circuit array with the second group of binary data to generate the second analog output.

20. A digital-to-analog converter comprising:
means for generating a first digital code, wherein the first digital code represents most significant bits of a digital input word;
means for switching between a first algorithm and a second algorithm to generate a second digital code, wherein the second digital code represents least significant bits of the digital input word, the first algorithm comprises performing a first modulo operation with the digital input word as a dividend, and the second algorithm comprises performing a second modulo operation with a sum of the digital input and an offset as a dividend;
means for converting first digital code into a first analog output; and
means for converting the second digital code into a second analog output, wherein a combination of the first analog output and the second analog output produces an analog version of the digital input word.

21. The digital-to-analog converter of claim 20, wherein the means for switching between the first algorithm and the second algorithm comprise means for detecting a boundary condition defined by an increasing value for the second digital code in response to a decreasing value for the digital input word or a decreasing value for the second digital code in response to an increasing value for the digital input word.

* * * * *